United States Patent
Yagi et al.

(10) Patent No.: US 7,736,445 B2
(45) Date of Patent: Jun. 15, 2010

(54) SURFACE TREATMENT METHOD FOR SOLDER JOINT

(75) Inventors: Ichiro Yagi, HongKong (CN); DeFeng Lu, Dongguan (CN); XiaoGang Yang, Dongguan (CN); DeYu He, Dongguan (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 322 days.

(21) Appl. No.: 11/889,643

(22) Filed: Aug. 15, 2007

(65) Prior Publication Data

US 2008/0280029 A1  Nov. 13, 2008

(30) Foreign Application Priority Data

May 10, 2007  (CN)  ........................ 2007 1 0104971

(51) Int. Cl.
  *C23C 8/40*  (2006.01)
  *C23C 22/60*  (2006.01)

(52) U.S. Cl. ........................ 148/277; 148/240; 148/243; 148/284; 106/14.05; 106/14.11; 106/14.21

(58) Field of Classification Search ................. 148/240, 148/243, 277, 284; 106/14.05, 14.11, 14.21
See application file for complete search history.

(56) References Cited

FOREIGN PATENT DOCUMENTS

JP          57-134294     *   8/1982

* cited by examiner

*Primary Examiner*—Roy King
*Assistant Examiner*—Lois Zheng
(74) *Attorney, Agent, or Firm*—Nixon & Vanderhye P.C.

(57) ABSTRACT

A surface treatment method for solder joint employs alkali buffer solution dipping the solder joint and the alkali buffer solution reacts with the solder joint thus yielding a passive layer. As the resultant passive layer forms on the surface of the solder joint, thereby prevents further corrosion and dissolution during aqueous cleaning or water dipping thereafter. In addition, the passive layer ensures a good appearance with maximum protection of the solder joint and also provides a sound reliability and a high testability of a finished electronic product equipped with the solder joint.

6 Claims, 3 Drawing Sheets

SURFACE TREATMENT METHOD FOR SOLDER JOINT

FIELD OF THE INVENTION

The present invention relates to a method for treating electronic device with solder joint, and more particularly to a surface treatment method for the solder joint to prevent the solder joint corrosion and dissolution during aqueous cleaning or water dipping.

BACKGROUND OF THE INVENTION

Tin and tin alloys are most common solders used to provide solder joints in a wide variety of electronic devices, such as chips, crystal oscillators, lead frames, printed circuit boards, head gimbal assemblies (HGA) and the like. In addition to providing electrical connections, the solder joint provides a vital mechanical link between electronic devices. For example, in the HGA, solder ball is used to electrically and mechanically connect a head slider to a suspension of the HGA.

A myriad of solder structures have been proposed for the interconnection of one electronic component to another, and many interconnect technologies have known to us for forming those solder connection structures, such as surface mount technology (SMT), ball grid array or BGA technology, solder ball bonding (SBB) or gold ball bonding (GBB) technology and so on. Regardless of the form of the solder connection or the method of making the solder connection, there are typically three stages at which cleaning of the solder surface may be essential. First, during deployment of the solder prior to making the connections, processing of solder may leave undesirable residues which will interfere with proper solder wetting of solder pads and need to be removed. Second, to allow good wetting of the solder on the solder pads, flux is most often used and will need to be removed to avoid leaving corrosive contaminants on the electronic device. Finally, rework of part-good assemblies requires special handling which may require a cleaning step that assures the reliability of the package.

Unfortunately, however, removal of the flux and flux products and cleaning of the solder is a difficult task because the cleaning process may itself be corrosive to the solder joint and/or electronic device. Additionally, dissolution of the solder can occur resulting in a smaller amount of solder forming the solder joint and cause disposal problems since the solders are generally lead/tin alloys and their solutions pose an environmental threat if discharged.

The corrosion and dissolution of the solder joint during cleaning is circumstantiated hereinafter. As an example, the solder is tin alloy, and the cleaning agent is water-based solution. As illustrated by FIG. 1, the tin (Sn) is undergoing electro-chemical corrosion. Such tin corrosion process includes two simultaneous reactions. One reaction is tin dissolution in water, which is an oxidation reaction. In this reaction, the tin (Sn) serves as an anode and releases electrons to form stannous ion ($Sn^{2+}$), which is expressed by equation (4). At the same time, another reaction, which is a reduction reaction, is proceeding. In this reaction, the oxygen gas that is dissolved in the aqueous solution serves as a cathode and reduces to hydroxyl ion ($OH^-$) by neutralizing the electrons, which is expressed by equation (40). The stannous ion ($Sn^{2+}$) and the hydroxyl ion ($OH^-$) formed by the above two reactions react with each other and thus yield tin hydroxide ($Sn(OH)_2$), which is expressed by equation (41). During drying process thereafter, as shown in FIGS. 2a-2d, the tin hydroxide crystallizes to become crystals on or holes in the solder joint surface (see equation (42)). These crystals or holes make the solder joint get grainier as it cools, thus a little movement can make cracks along the crystals and form a high resistance joint. Moreover, such structure of the solder joint may affect both the reliability and the testability of the finished electronic product. In addition, after tin dissolution and crystallization during aqueous cleaning or water dipping, the solder joint surface causes the finished electronic product poor in appearance.

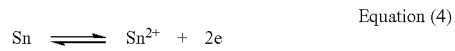

Equation (4)

Equation (40)

Equation (41)

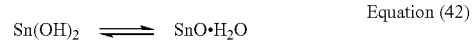

Equation (42)

Hence, a strong need has arisen for providing an improved method of treating the solder joint surface to overcome the above disadvantages.

SUMMARY OF THE INVENTION

Accordingly, an object of the present invention is to provide a surface treatment method for solder joint to inhibit the solder joint corrosion and dissolution during aqueous cleaning or water dipping.

To achieve the above-mentioned object, the present invention provides a surface treatment method for solder joint comprising steps of: (1) making alkali buffer solution; (2) dipping products with solder joint into the alkali buffer solution for a period of time; (3) rinsing the products to remove alkali remained thereon. After treatment by this method, a passive layer is formed on a surface of the solder joint, so the solder joint is inhibited corrosion and dissolution during subsequent aqueous cleaning.

Preferably, pH of the alkali buffer solution is controlled within a range from 9.5 to 11.5.

In the invention, the alkali buffer solution includes chemical compositions selected from carbonates, hydrates, ammonia, amine and mixtures.

Preferably, the period of time in step (2) is at least 5 minutes.

As an embodiment of the present invention, the alkali buffer solution is solution of sodium bicarbonate ($NaHCO_3$) and sodium carbonate ($Na_2CO_3$). Also preferably, pH of the alkali buffer solution is held at 10.5.

As another embodiment of the present invention, the step (3) is performed by dipping the products with solder joint into water for another period of time. Preferably, the period of time in the step (3) is at least 2 minutes.

In comparison with the prior art, the present method employs the alkali buffer solution dipping the solder joint and the alkali buffer solution reacts with the solder joint thus yielding the passive layer. As the resultant passive layer forms on the surface of the solder joint, thereby prevents further corrosion and dissolution during aqueous cleaning or water dipping thereafter. In addition, the passive layer ensures a good appearance with maximum protection of the solder joint and also provides a sound reliability and a high testability of a finished electronic product equipped with the solder joint.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
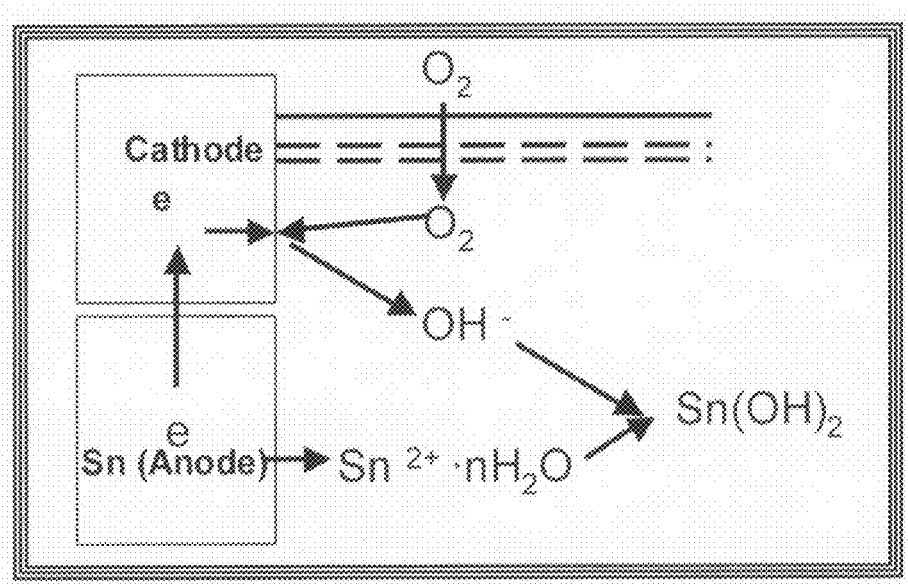
FIG. 1 illustrates general mechanism of tin electro-chemical corrosion that occurs during aqueous cleaning or water dipping according to a prior art.
Figure 2A:
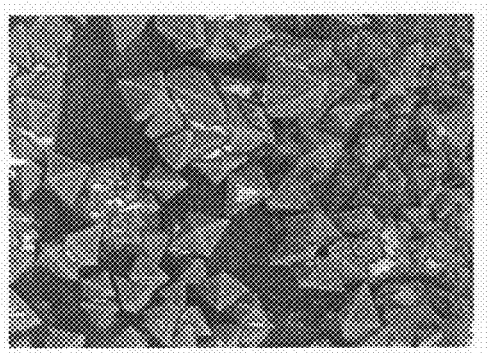
FIGS. 2a-2d show examples of solder joint surface with crystals formed thereon after aqueous cleaning or water dipping.
Figure 2B:
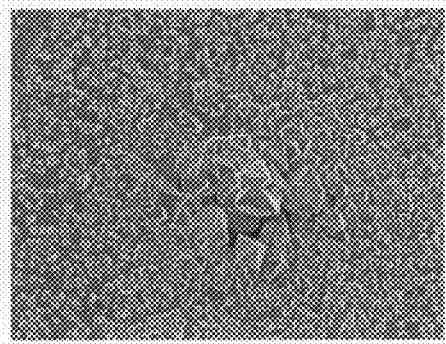
Figure 2C:
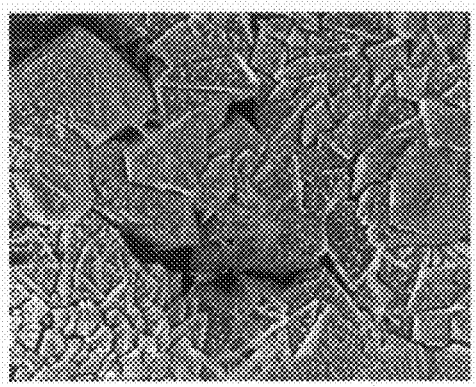
Figure 2D:
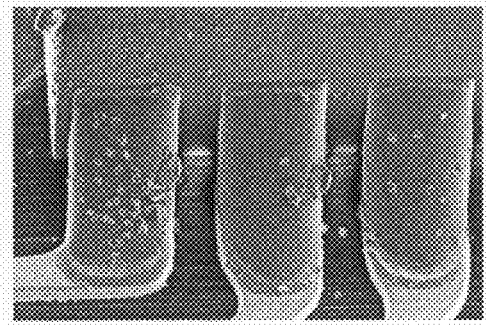

Various preferred embodiments of the invention will now be described with reference to the figures, wherein like reference numerals designate similar parts throughout the various views. As indicated above, the invention is directed to a surface treatment method for solder joint. The method employs alkali buffer solution dipping the solder joint. When the solder joint is dipped into the alkali buffer solution, the solder joint will react with the alkali buffer solution and produce a passive layer on the surface of the solder joint. Because of the existence of the passive layer, the present method successfully prevents the solder joint from further corrosion and dissolution during aqueous cleaning or water dipping thereafter. In addition, the passive layer ensures a good appearance with maximum protection of the solder joint and also provides a sound reliability and a high testability of a finished electronic product equipped with the solder joint.

Figure 3:
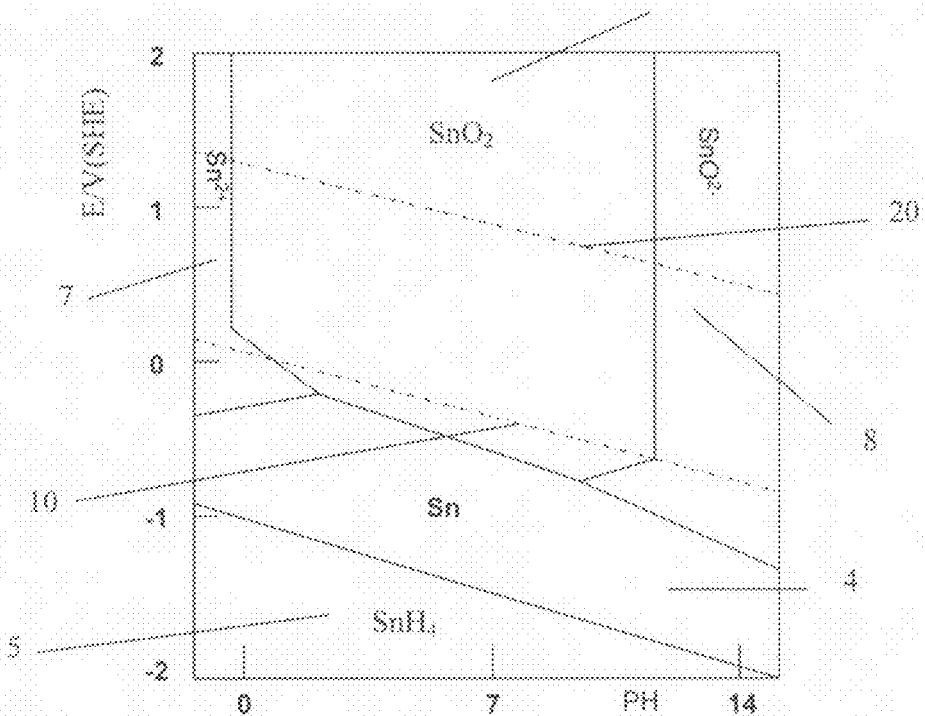
FIG. 3 is a Pourbaix potential-pH diagram for tin.

The principles of the present invention is established on analysis of a Pourbaix potential-pH diagram. To be specific, the Pourbaix potential-pH diagram presents a map of individual regions defining reaction products of a metal in an aqueous solution. In addition, the Pourbaix potential-pH diagram also identifies conditions under which 1) the metal is stable and will not corrode, 2) soluble reaction products are formed and corrosion will occur, and 3) insoluble reaction products are formed and passivity will occur. Hence, the Pourbaix potential-pH assists in determining which corrosion reactions are possible in a given aqueous environment. Generally, the Pourbaix potential-pH diagram is a view illustrating potential of the metal in plotted against pH of the solution FIG. 3 shows the Pourbaix potential-pH diagram for tin in an aqueous environment. The diagram shows the regions of stability for species including tin (Sn), stannous ion ($Sn^{2+}$), tin dioxide ($SnO_2$), stannate radicle ($SnO^{2-}$) and stannic hydride ($SnH_4$). These regions consists of two regions 7 and 8 where tin will corrode, two regions 5 and 6 where a passivation layer can form, and a region 4 which is an immunity region where tin will be stable in the zero oxidation state.

Line 10 represents a redox equilibrium reaction for hydrogen ions ($H^+$) to evolve hydrogen gas ($H_2$) (see equation (10)). At any potential below line 10, the hydrogen ion ($H^+$) in water will react with electrons to evolve hydrogen gas ($H_2$).

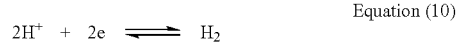

$$2H^+ + 2e \rightleftharpoons H_2 \qquad \text{Equation (10)}$$

Line 20 represents a redox equilibrium reaction for oxygen ($O_2$) plus hydrogen ions ($H^+$) to form water ($H_2O$) (see equation 20). At any potential above line 20, the water ($H_2O$) is ionized to evolve oxygen gas ($O_2$) and hydrogen ions ($H^+$) (see the reverse of equation (20)).

$$O_2 + 4H^+ + 4e \rightleftharpoons 2H_2O \qquad \text{Equation (20)}$$

Water is therefore thermodynamically stable in regions between line 10 and line 20 and there is no gas evolved.

According to the analysis mentioned above and the diagram illustrated, tin is passivated into tin dioxide in alkali buffer solution, hence a passive layer comprised of tin dioxide can form on a surface of the tin. Specifically, once exposed to the alkali buffer solution, the solder joint of tin is not ionized but tends to become oxide. That is, the solder joint reacts with the alkali buffer solution and accordingly yields tin dioxide. As the reaction going on, the tin dioxide increases constantly and accumulates gradually to form a passive layer on the surface of the solder joint. Finally, the whole surface of the solder joint could be completely covered by the resultant tin dioxide. After alkali buffer solution treatment, the passive layer on solder joint surface enables to prevent the solder joint from further corrosion and dissolution during aqueous cleaning or water dipping thereafter which, in turn, ensures a good appearance with maximum protection of the solder joint and accordingly provides a sound reliability and a high testability of a finished electronic product equipped with the solder joint.

Figure 4:
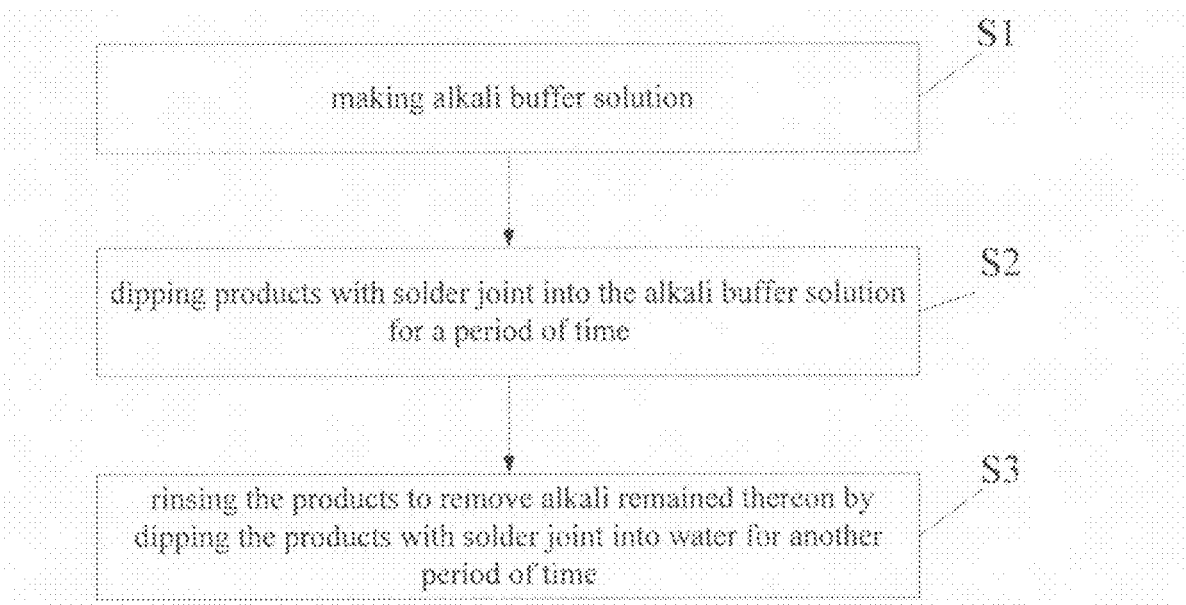
FIG. 4 is an example flowchart illustrating a method for surface treatment of solder joint in accordance with the present invention.

Referring to FIG. 4, based on the principles illustrated above, a surface treatment method for solder joint according to the present invention comprises steps of: (1) making alkali buffer solution (step S1); (2) dipping products with solder joint into the alkali buffer solution for a period of time (step S2); (3) rinsing the products to remove alkali remained thereon by dipping the products with solder joint into water for another period of time (step S3). After treatment by this method, a passive layer is formed on a surface of the solder joint to inhibit the solder joint corrosion and dissolution during subsequent aqueous cleaning.

It is appreciated that the alkali buffer solution employed in the present invention could have some preferred alternatives that may gain much more advantageous effects and accordingly optimize properties of the surface treatment. Specifically, the pH of the alkali buffer solution of the invention is controlled within a range from 9.5 to 11.5. Furthermore, the alkali buffer solution of the invention may include chemical compositions selected from inorganic and organic chemicals, such as carbonates, hydrates, ammonia, amine and mixtures. Preferably, the alkali buffer solution for surface treatment is solution of $NaHCO_3$ and $Na_2CO_3$ which alternatively possesses an optimal, typical pH value of 10.5. In the invention, the period of time in step S2 mentioned above is preferably at least 5 minutes and the period of time in step S3 is preferably at least 2 minutes.

Figure 5:
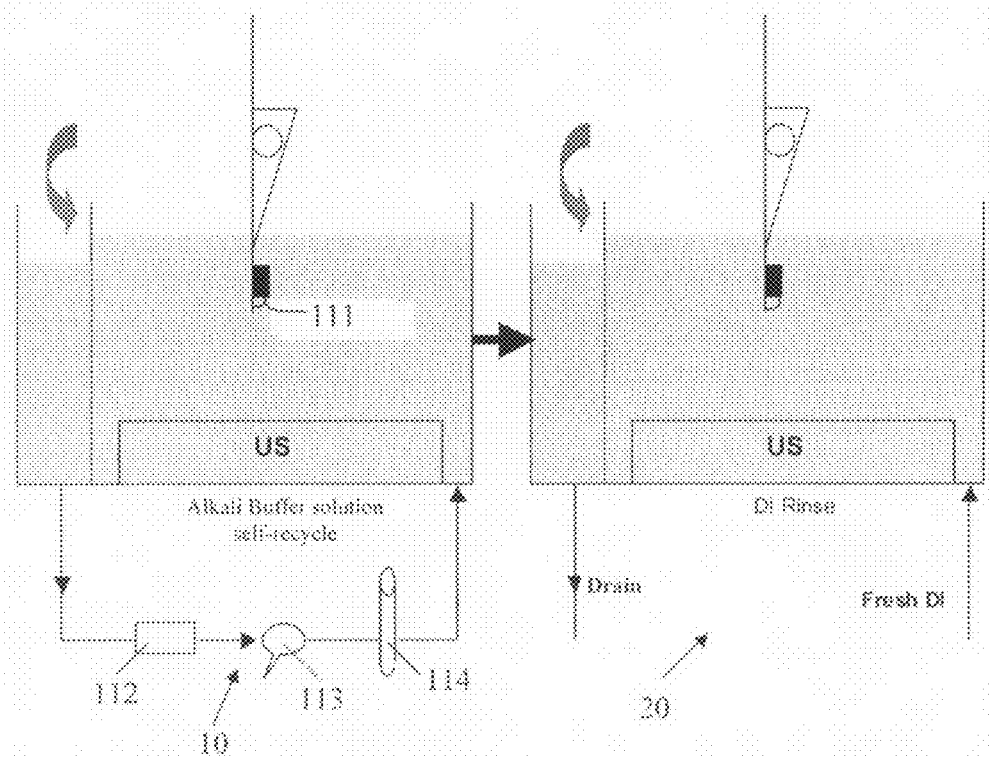
FIG. 5 schematically describes alkali buffer solution chemical treatment processes for SBB joint of HGA.

FIG. 5 schematically illustrates the specific alkali buffer solution chemical treatment processes for SBB joint of HGA 111 according to the present invention. Hereinafter, the alkali buffer solution chemical treatment method of FIG. 5 will be described in detail.

The preliminary step is to make alkali buffer solution of $NaHCO_3$ and $Na_2CO_3$ with a constant and specified pH value of 10.5.

The second step is to provide an alkali buffer solution self-recycle tank 10 which is used to contain the alkali buffer solution mentioned above. Specifically, a conventional pH meter 112 for testing and monitoring the pH value of the alkali buffer solution, a pump 113 and a filter 114 are equipped with the tank 10. Under pump pressure, the alkali buffer solution is diverted into the alkali buffer solution self-recycle tank 10. Then the HGA 111 with SBB joint are dipped into the alkali buffer solution for a predetermined time. It is understandable that the time should be enough to effectively treat the surface of the HGA 111. In this subject embodiment, the time required is best to be at least 5 minutes, and during the period the HGA 111 is kept immersed in the alkali buffer solution and the pH of the alkali buffer solution is held at 10.5. The alkali buffer solution is circularly used after filtrated by the filter 114.

The third step is to provide water which is capable of rinsing the HGA 111 and then dip the HGA 111 with SBB joint into the water for another period of time to remove alkali remained thereon. In the embodiment, the water is preferably DI (deionized) water, since the DI water is less likely to recontaminate the surface of the HGA 111. The DI water is continually refreshed and drained through a DI rinse tank 20. It will be appreciated that contacting between the HGA 111 and the DI water may be allowed to continue for sufficient time to effectively remove the alkali. In the embodiment, the time required is best to be at least 2 minute and thus during the period the HGA 111 is kept immersed in the DI water. After rinsed, the HGA 111 goes through normal cleaning line. As described above, the passive layer formed on the SBB joint will inhibit the SBB joint corrosion and dissolution during cleaning.

Thus, the present invention provides, in various embodiments, an improved surface treatment method for solder joint.

The foregoing descriptions of specific embodiments have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, and to enable others skilled in the art to best utilize the invention and various embodiments with various modifications as are suited to the particular use contemplated. It is intended that the scope of the invention be defined by the claims appended hereto and their equivalents.

What is claimed is:

1. A surface treatment method for a tin alloy solder joint, the method comprising:
   (1) making an alkali buffer solution of $NaHCO_3$ and $Na_2CO_3$, having a pH controlled within a range from 9.5 to 11.5;
   (2) dipping products with at least one tin alloy solder joint into the alkali buffer solution for a period of time; and
   (3) rinsing the products to remove alkali remaining thereon;
   wherein a passive layer is formed on a surface of the at least one tin alloy solder joint to reduce solder joint corrosion and dissolution during subsequent aqueous cleaning.

2. The method according to claim 1, wherein the period of time in (2) is at least 5 minutes.

3. The method according to claim 1, wherein the pH of the alkali buffer solution is held at 10.5.

4. The method according to claim 1, wherein (3) is performed by dipping the products with at least one tin alloy solder joint into water for another period of time.

5. The method according to claim 4, wherein the period of time in (3) is at least 2 minutes.

6. The method according to claim 1, wherein the product is a head gimbal assembly.

* * * * *